(12) United States Patent
Okada

(10) Patent No.: US 7,203,581 B2
(45) Date of Patent: Apr. 10, 2007

(54) ELECTRONIC CONTROL UNIT FOR CONTROLLING UPDATING OF DATA IN NON-VOLATILE MEMORY

(75) Inventor: Kazunori Okada, Chiryu (JP)

(73) Assignee: Denso Corporation, Kariya, Aichi-pref. (JP)

( * ) Notice: Subject to any disclaimer, the term of this patent is extended or adjusted under 35 U.S.C. 154(b) by 248 days.

(21) Appl. No.: 10/678,090

(22) Filed: Oct. 6, 2003

(65) Prior Publication Data

US 2004/0093137 A1 May 13, 2004

(30) Foreign Application Priority Data

Oct. 21, 2002 (JP) ............................. 2002-305813

(51) Int. Cl.
*G06F 12/10* (2006.01)
(52) U.S. Cl. .................. 701/35; 701/36; 365/189.04; 711/103; 711/162
(58) Field of Classification Search ................ 701/35, 701/36; 711/103, 104, 105, 162, 165; 365/185.08, 365/185.14, 189.01, 185.01, 189.04, 185.29
See application file for complete search history.

(56) References Cited

U.S. PATENT DOCUMENTS

| | | | | | |
|---|---|---|---|---|---|
| 5,243,561 | A | * | 9/1993 | Yamauchi | 365/189.12 |
| 5,579,522 | A | * | 11/1996 | Christeson et al. | 713/2 |
| 5,630,139 | A | * | 5/1997 | Ozaki | 717/167 |
| 5,689,453 | A | * | 11/1997 | Tsukagoshi | 365/45 |
| 5,745,425 | A | * | 4/1998 | Anderson et al. | 365/226 |
| 5,799,200 | A | * | 8/1998 | Brant et al. | 713/340 |
| 5,964,813 | A | * | 10/1999 | Ishii et al. | 701/35 |
| 5,987,573 | A | * | 11/1999 | Hiraka | 711/156 |
| 6,000,021 | A | * | 12/1999 | Saito et al. | 711/163 |
| 6,128,675 | A | * | 10/2000 | Ko | 710/23 |
| 6,732,241 | B2 | * | 5/2004 | Riedel | 711/154 |
| 2001/0007533 | A1 | * | 7/2001 | Kobayashi et al. | 365/185.11 |
| 2002/0026566 | A1 | * | 2/2002 | Awada et al. | 711/162 |
| 2002/0156988 | A1 | * | 10/2002 | Toyama et al. | 711/203 |
| 2002/0191442 | A1 | * | 12/2002 | Kobayashi et al. | 365/185.11 |
| 2003/0048659 | A1 | * | 3/2003 | Kanamori et al. | 365/185.08 |
| 2003/0221083 | A1 | * | 11/2003 | Hill et al. | 711/207 |

FOREIGN PATENT DOCUMENTS

| | | |
|---|---|---|
| JP | 4-217053 | 8/1992 |
| JP | 4-336351 | 11/1992 |
| JP | 2002-106411 | 4/2002 |

* cited by examiner

*Primary Examiner*—Tuan C To
(74) *Attorney, Agent, or Firm*—Nixon & Vanderhye P.C.

(57) ABSTRACT

An electronic control unit continuously stores data indicating the monitoring frequency of the diagnosis items determined by the RateBase monitoring method and is increased one by one with the maximum amount of change in the single operating period to an EEPROM. When any data is incremented by one, this data is entered to the EEPROM and the write completion flag for this data is turned on. Thereafter, in this operating period, this data is never entered to the EEPROM. Therefore, reduction and increase in the number of times of data entry to the programmable non-volatile memory and reliable storage of this data can be realized effectively.

11 Claims, 7 Drawing Sheets

ELECTRONIC CONTROL UNIT FOR CONTROLLING UPDATING OF DATA IN NON-VOLATILE MEMORY

CROSS REFERENCE TO RELATED APPLICATION

This application is related to and incorporates herein by reference Japanese Patent Application No. 2002-305813 filed on Oct. 21, 2002.

FIELD OF THE INVENTION

The present invention relates to an electronic control unit for storing particular data to be updated or rewritten during its operation into a non-volatile memory, which is available for electrical update or updating of the data but has a limitation on the number of times of data entry.

BACKGROUND OF THE INVENTION

Conventional electronic control units for a vehicle are so constructed as to write particular data into an BEPROM (electrically-erasable and programmable read only memory) available for use in electrically updating the data. The particular data may be diagnostic information and control learning values etc. required to be continuously stored even if the supply of operation power source is suspended. This data is referred to as continuous storage object data. The electronic control unit thus constructed can continuously store and update the data even if a battery is disconnected or discharged completely.

As one of such electronic control units, JP-A-336351/1992 (Heisei 4) discloses a device so constructed as to sequentially copy and store, within an EEPROM, data of the predetermined domain of a RAM with a backup battery being charged. This RAM is referred to as a backup RAM. The device, when powered on, on detecting a failure in the data stored in the RAM, copies the data in the EEPROM to the RAM for recovery.

To cope with the limitation of a programmable non-volatile memory such as EEPROM in the number of times of data entry, JP-A-336351/1992 (Heisei 4) discloses a device that is so constructed as to save the number of times of data entry to EEPROM. The device makes a comparison between the data in the backup RAM and the data in the EEPROM in every fixed period, and copies the data in the backup RAM to the EEPROM if any differences are found.

Moreover, JP-A-217053/1999 (Heisei 4) discloses another method where data entry is performed only when data has been changed under the condition that a power source is turned off.

Meanwhile, in the case of the electronic control unit for vehicle, the RateBase monitoring method is specified in the regulation of the OBD (Onboard Diagnostic) 2 by the CARB (California Air Resources Board). In this RateBase monitoring method, the monitoring frequency expressed by the following formula must be stored continuously as the continuous storing object data.

Monitoring frequency=Number of times of Implementation of the monitoring/Number of times of operation Here, the monitoring frequency indicates the frequency of implementation of the diagnosis. It is respectively applied to the diagnosis of a plurality of items such as catalytic converter, fuel evaporation system, oxygen sensor.

The number of times of operation (denominator) is the data which is incremented when the predetermined running condition specified in the regulation for this item. Moreover, the number of times of implementation of monitoring (numerator) is the data which are incremented when the diagnosis implementation condition specified by an automobile maker is specified for this item and determination for normal or irregular operation is completed.

Moreover, these denominator and numerator are once incremented during the period specified by ON and OFF of an ignition switch of a vehicle (that is, during the single operation period until the operation power source is turned off after this power source is turned on to an electronic control unit which implements the diagnosis) or maintain the present values. Therefore, when these denominator and numerator of each item are once incremented, the values are no longer updated during the present operation period of vehicle.

It is assumed that the electronic control unit continuously stores to the non-volatile memory such as EEPROM the data that are increased or decreased in its value like the numerator and denominator in the RateBase monitoring method, depending on the specified rule and that is changed in its value at the maximum only by N (where N is a positive number and N=1 in the RateBase monitoring method) during the single operation period from the time the unit is powered on to the time it is powered off. In this case, in order to save the number of times of data entry to the non-volatile memory, it is considered to use the method of JP-A-336351/1992 (Heisei 4).

However, in the method of JP-A-336351/1992 (Heisei 4), even if a value of the continuous storage object data is changed only by N during signal operation period of the electronic control unit and such a value can no longer be updated, the data in the backup RAM is compared with the data in the EEPROM in every period. Thus, useless processes are generated to a considerable degree. Particularly, in the EEPROM, data read/write operation is generally implemented through the serial communication between the microcomputers. Therefore, longer time is required for comparison between the data in the backup RAM and in the EEPROM and it is not effective to execute useless comparing processes.

Moreover, for example, it is also considered to write the continuous storage object data in the backup RAM into the programmable non-volatile memory such as EEPROM or the like only when the electronic control unit starts to operate. However, when the circuits are constructed to always implement the entry of continuous storage object data into the non-volatile memory bridging over the operation periods, the number of times of data entry can be reduced but the final value of data is stored only in the backup RAM while the device is not operated. Accordingly, if disconnection and complete discharge of battery are generated, it is no longer possible to surely update the data stored in the programmable non-volatile memory. This is also applied when a fault is generated in the standby RAM itself.

On the other hand, when the data is written into the programmable non-volatile memory such as the EEPROM or the like while the operation power source to the electronic control unit is turned off as in the case of JP-A-217053/1992 (Heisei 4), the operation power source is generally supplied to the electronic control unit only when the ignition switch is turned on or when a main relay for power feeding provided at the external side of the electronic control unit is turned on.

Accordingly, the electronic control unit may be constructed to continue the operation even after the ignition switch is turned off by turning on the main relay by itself after it is operated when the ignition switch is turned on. That is, upon detection that the ignition switch is turned off, the electronic control unit can prevent generation of the event that the operation power source is turned off before the continuous storage object data is completely written into the programmable non-volatile memory by implementing the procedures that the continuous storage object data on the RAM is written to the programmable non-volatile memory and thereafter the main relay is turned off.

However, even when the main relay is provided, since the battery voltage as the operation power source generally becomes unstable after the ignition switch is turned off, it is probable that the data in the programmable non-volatile memory cannot be updated. That is, if the microcomputer is reset due to the drop of the power source voltage, the latest continuous storage object data will be lost. Therefore, it is preferable that the continuous storage object data is entered to the programmable non-volatile memory, if it is possible, while the ignition switch is turned on.

SUMMARY OF THE INVENTION

The present invention therefore has an object to effectively realize reduction in the number of times of data entry to a programmable non-volatile memory, and also reliable storage of data thereto in an electronic control unit. This unit continuously stores the data which is increased or decreased depending on the specified rule and is changed in the value by only N at a maximum during single operation period using the programmable non-volatile memory.

To attain the above object, the electronic control unit of the invention is so constructed as to continuously store the data which should be stored continuously even when the unit is powered off (continuous storage object data) to the non-volatile memory. The non-volatile memory is an electrically programmable non-volatile memory with a limitation in the number of times of data entry. Specifically, the unit is so constructed as to store the continuous storage object data, which is increased or decreased in its value according to the specified rule and is changed in its value only by N at a maximum (N is a positive number) during the single operation period from the time the unit is powered on to the time the unit is powered off, to the non-volatile memory.

The electronic control unit of the present invention is particularly constructed to implement, when the value of the continuous storage object data is changed only by N during the single operation period, the write process to enter such continuous storage object data changed in the value only by N but not to implement thereafter the write process of such continuous storage object data changed in the value only by N to the non-volatile memory during the operation period.

The electronic control unit is capable of controlling the number of times of the continuous storage object data to the non-volatile memory and implementing the entry of the continuous storage object data (in more detail, the continuous storage object data which is changed in the value only by N and has reached the final value during the present operation period) to the non-volatile memory within the present operation period where the operation power source is stabilized without bridging over the operation periods. Moreover, when the entry of continuous storage object data to the non-volatile memory is completed, useless process for entry of such dada to the non-volatile memory is no longer implemented during the present operation period.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
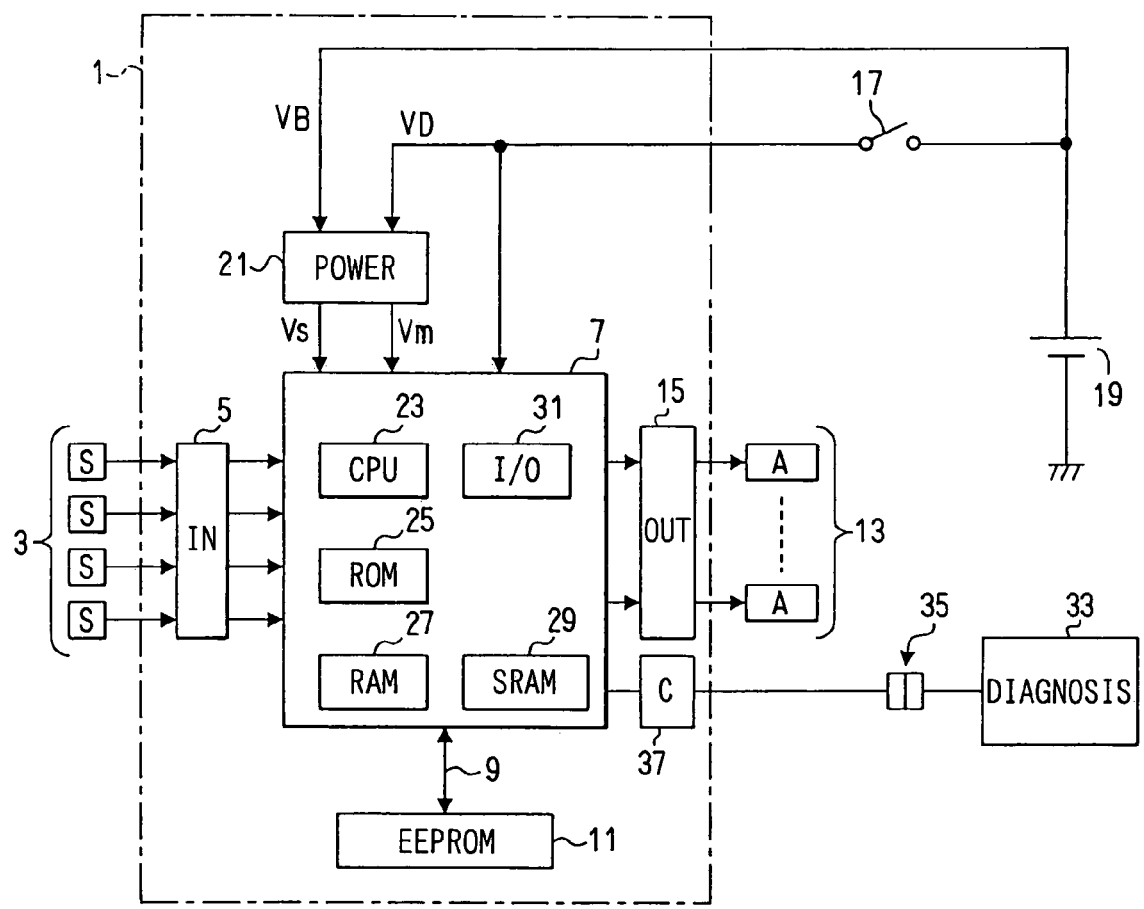
FIG. 1 is a block diagram showing a structure of an electronic control unit (ECU) according to a first embodiment of the present invention.

As is illustrated in FIG. 1, an ECU 1 is provided with: an input processing circuit 5 which receives, for the waveform processes, the signals from various sensors 3 to detect the operating condition of an engine of a vehicle and conditions of the peripheral devices of the engine; a microcomputer 7 which performs various processes for engine control and diagnosis based on the sensor signals from the input processing circuit 5; an EEPROM 11 as a programmable non-volatile memory which is connected to the microcomputer 7 via communication line 9 to store the data (continuous storage object data), which should be stored even when supply of power to the ECU 1 is suspended, among the data calculated with the microcomputer 7; and an output circuit 15 which drives actuators 13 such as fuel injectors and an igniter or the like mounted to the engine depending on the control signals from the microcomputer 7.

The ECU 1 is further provided with: a power supply circuit 21 which receives a battery voltage VB as the operation power (operation power source voltage VD) from a battery 19 supplied when an ignition switch 17 of the vehicle is turned on to supply the power source voltage Vm (for example, 5V) for operation to each element in the ECU 1 as well as the microcomputer 7, and generates and outputs a sub-power source voltage Vs to always hold the data with a standby RAM (SMAM) 29 provided in the microcomputer 7 from the voltage VB which is always supplied from the battery 19.

The power supply circuit 21 is also provided with a power-on reset function which outputs a reset signal to the microcomputer 7 only during the predetermined time in which the power source voltage Vm is stabilized from the timing where the ignition switch 17 is turned on and supply of the power source voltage Vm is started.

The microcomputer 7 is provided with the well-known CPU (central processing unit) 23 to execute various programs, a non-volatile ROM 25 to store the programs executed by the CPU 23 (in more detail, instruction codes forming such program and fixed data referred to when the program is executed), a volatile RAM 27 to temporarily store the calculation result or the like of the CPU 23, the standby RAM 29 to receive the sub-power source voltage Vs from the power supply circuit 21 to continuously store the data (RAM with battery backup, SRAM), and an I/O 31 to exchange the signal and data with the EEPROM 11. The ordinary RAM 27 not provided with a battery backup is referred to as a normal RAM (NRAM).

The ECU 1 operates by receiving the voltage VD from the battery 19 while the ignition switch 17 is turned on.

In the ECU 1, when the ignition switch 17 is turned on and a reset signal to the microcomputer 7 from the power supply circuit 21 is cancelled, the microcomputer 7 starts its operation from the initial condition and performs the initial processes. Thereafter, the microcomputer 7 executes the control processes to control the engine. The microcomputer 7 is operated when the CPU 23 executes the programs stored in the ROM 25.

Moreover, the microcomputer 7 periodically determines, for each diagnosis object items (catalyst converter, fuel evaporation system, oxygen sensor or the like) determined by the RateBase monitoring method of CARB/OBD2 described above, for example, whether the diagnosis implementation condition of such items has been established or not and also executes the processes such as determination of normal or irregular operation through implementation of the diagnostic process for the relevant item when the diagnosis implementation condition is established. Moreover, the microcomputer 7 continuously store and update the data of numerator indicating the monitoring frequency and denominator (number of times of operation) for each diagnosis object item using the EEPROM 11. The monitoring frequency means the number of times of implementation of monitoring as the number of times of diagnosis.

In addition, the ECU 1 is connected with a diagnostic tool 33 provided at the external side of the vehicle via a diagnostic connector 35 and a communication circuit 37. The ECU 1 also outputs the data having the content corresponding to the request in response to an output request for diagnosis from the diagnostic tool 33 and outputs the data of numerator and denominator stored in the EEPROM 11 when output of information about the diagnosis monitoring frequency is requested.

Here, the process to output the data of numerator and denominator stored in the EEPROM 11 to the diagnostic tool 33 depending on the output request from the diagnostic tool 33 is executed with the microcomputer 7 through the communication circuit 37.

Next, the processes with which the microcomputer 7 of ECU 1 continuously stores and updates the data of the numerator denominator of the monitoring frequency for each diagnosis object item will be described with reference to FIG. 2 to FIG. 5.

Figure 2:
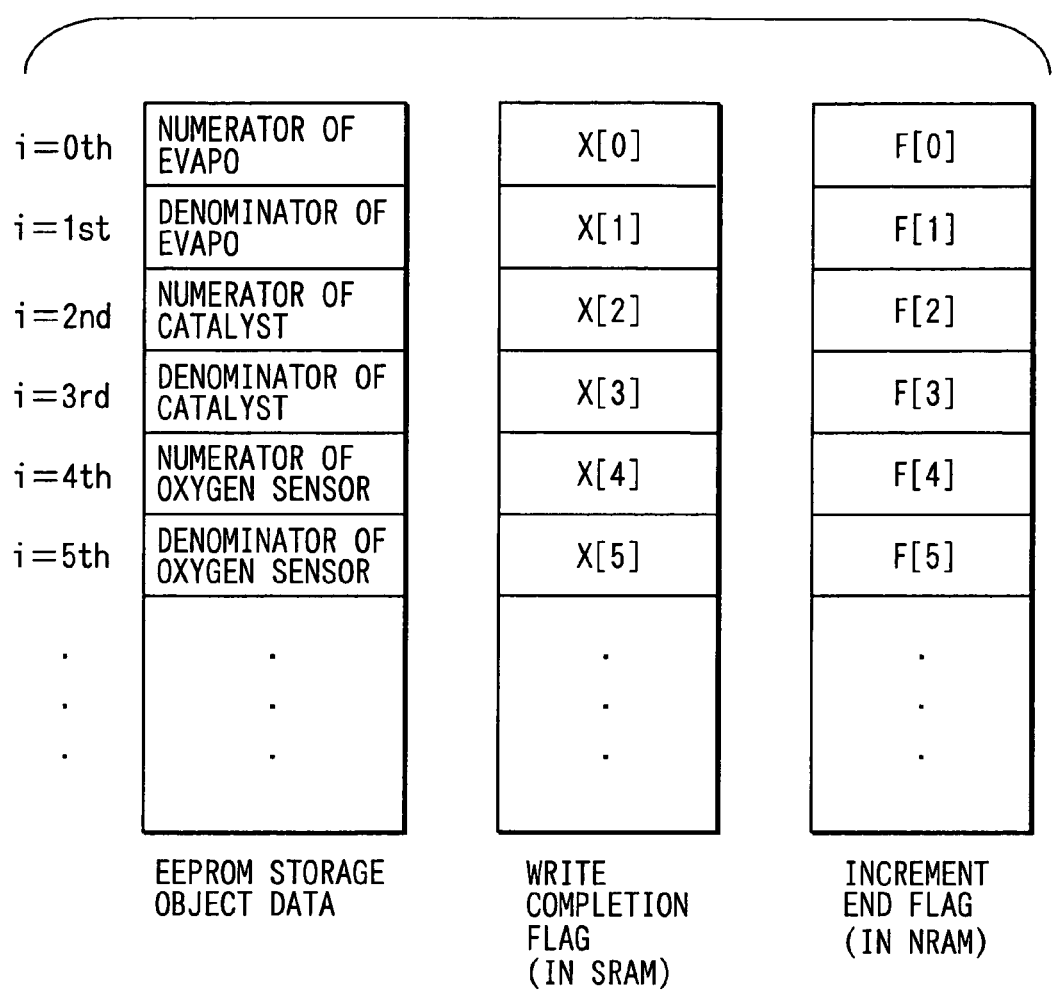
FIG. 2 is an explanatory diagram for explaining continuous storage data stored in an EEPROM, a write completion flag and an increment completion flag.

First, as illustrated in FIG. 2, the continuous storage object data as the numerator and denominator of the monitoring frequency for each diagnosis object item (that is, each data to be stored in the EEPROM 11) are sequentially given the number from 0 in this embodiment. For example, the $0^{th}$ data is the numerator of the monitoring frequency of the fuel evaporation system (evapo), the $1^{st}$ data is the denominator of the monitoring frequency of evapo, the $2^{nd}$ data is the numerator of the monitoring frequency of the catalyst converter (catalyst), the $3^{rd}$ data is the denominator of the monitoring frequency of catalyst, the $4^{th}$ data is the numerator of the monitoring frequency of the oxygen sensor, and the $5^{th}$ data is the denominator of the monitoring frequency of the oxygen sensor.

The EEPROM 11 is respectively provided with the domains to store the numerator and denominator of each diagnosis object and each data of numerator and denominator is respectively stored in the diagnosis object domain within the EEPROM 11.

Moreover, as illustrated in FIG. 2, the SRAM 29 is provided, for each continuous storage object data, with a write completion flag X [i] which shows whether the entry of data to the EEPROM 11 has been completed or not. Moreover, the NRAM 27 is provided, for each continuous storage object data, with an increment completion flag F [i] which shows whether increment of data has been implemented or not. Here, i in the brackets [ ] the continuous storage object data number corresponding to the flag thereof and takes any one of 0 to [n−1] when the total number of continuous storage object data is n.

Figure 3:
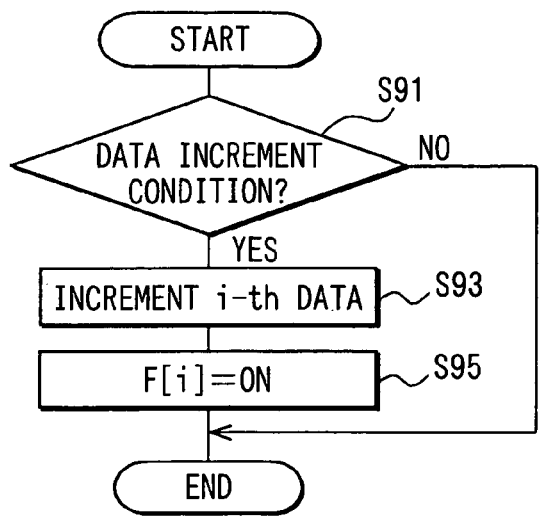
FIG. 3 is a flowchart showing the processes when a microcomputer of the electronic control unit (ECU) increments the continuous storage object data on a RAM.

When the data increment condition is established (Step 91: YES) for the continuous storage object data as illustrated in FIG. 3, the microcomputer 7 increments such data by one on the NRAM 27 (Step 93) and turns on the increment completion flag F [i] corresponding to such data (Step 95).

As described above, it is determined that the increment condition has been established when i-th has been detected, with the processes as the detecting means, that the predetermined running conditions specified by the regulation for the diagnosis object item has been satisfied to the data of the denominator (that is, a vehicle has entered the predetermined running operation specified with the regulation for the diagnosis object item).

Moreover, for the data of the numerator, it is determined that the increment condition is established when the predetermined diagnosis implementation condition specified with a vehicle maker is determined, such diagnosis is implemented. It is determined to have normally or irregularly completed, with the processes as the diagnostic means for the diagnosis object item. Meanwhile, all increment completion flags F[i] in the NRAM 27 are previously cleared to OFF due to the initialization (Step 205 of FIG. 5) for the NRAM 27 with the initial process executed when the microcomputer 7 starts the operation thereof.

Figure 4:
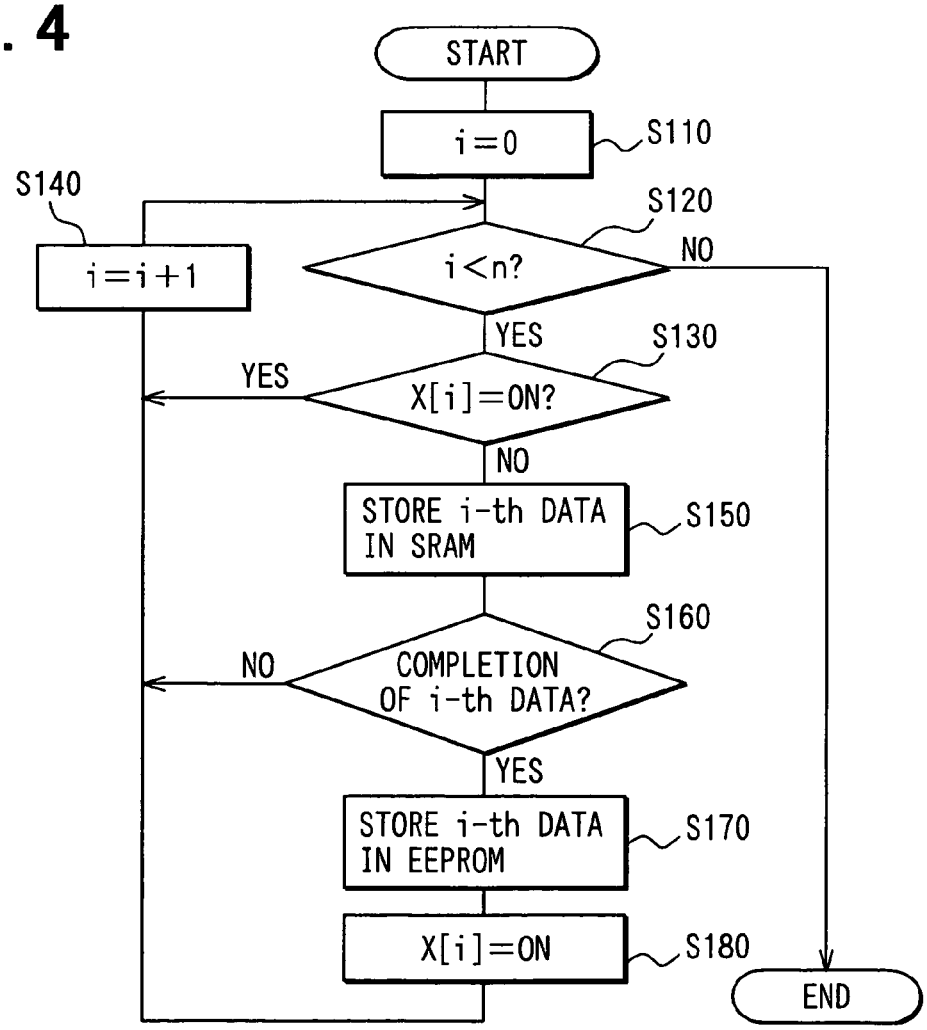
FIG. 4 is a flowchart showing routine processes in the first embodiment.

Next, FIG. 4 is a flowchart showing the routine processes which are executed by the microcomputer 7 in every constant period (for example, in every 64 ms).

When the microcomputer 7 starts the routine process of FIG. 4, it sets, at step S110, the variable i indicating the continuous storage object data number to 0 and determines, at step S120, whether the value of variable i is smaller than the total number n (number of data) of the continuous storage object data or not. The variable i is the data within the NRAM 27.

When it is determined that the value of variable i is smaller than the number of data n (Step 120: YES), the process proceeds to step 130 to determine that the write completion flag X[i] in the SRAM 29 is turned on or not for the i-th continuous storage object data (that is, the continuous storage object data having the number equal to the value of variable i). When the write completion flag X[i] is already turned on (Step 130: YES), the process proceeds to Step S140 to increment the value of variable i by one (1). Thereafter, the process returns to Step 120.

Moreover, when it is determined at step 130, the write completion flag X[i] is not turned on, (Step 130: NO), the process proceeds to step 150 and the i-th continuous storage object data among those processed on the NRAM 27 is stored (copied) to the SRAM 29 from the NRAM 27.

In the subsequent Step 160, it is determined whether the i-th continuous storage object data is incremented or not (that is, whether the value of the continuous storage object data has been changed only by 1 which is equal to the maximum changing amount N in the single operation period) depending on whether the increment completion flag F[i] corresponding to such data is turned on or not. When it is thereby determined that the i-th continuous storage object data is not yet incremented (that is, the increment completion flag F[i] is not yet turned on) (Step 160: NO), the process proceeds to step 140 to increment the value of variable i by one (1), and thereafter the process returns to step 120.

Moreover, when it is determined at step 160, that the increment of the i-th continuous storage object data is completed (S160: YES), the process proceeds to step 170 to store (copy) the i-th continuous storage object data to the EEPROM 11 from the NRAM 27. Accordingly, the stored value in the ERPROM 11 of the i-th continuous storage object data is updated to the value which is once updated (that is, the value incremented by one (1)). That is, when the increment condition of any continuous storage object data is established, the stored value in the EEPROM 11 in the continuous storage object data is updated to the value which is once updated.

In the next step 180, the write completion flag X[i] in the SRAM 29 is turned on for the i-th continuous storage object data, and thereafter the process proceeds to step 140 to increment the value of variable i by one (1). Thereafter, the process returns to step 120. All write completion flags X[i] in the SRAM 29 are previously cleared to OFF during the initial process (Step 280 in FIG. 5) executed when the microcomputer 7 starts the operation.

On the other hand, when it is determined that the value of variable i is not smaller than the number of data n (that is, i≧n) (Step 120: NO), the routine process is completed.

That is, in the routine process of FIG. 4, the continuous storage object data not yet written into the EEPROM 11 from the NRAM 27 during the present operation period of this ECU 1 is searched by checking the write completion flag X [i] for all continuous storage object data with the processes at steps 110 to 140. When the continuous storage object data on the NRAM 27 not yet written into the EEPROM 11 (that is, the continuous storage object data in which the write completion flag X[i] is OFF) exists (S130: NO), such data is copied to the SRAM 29 from the NRAM 27 (Step 150). Moreover, when such data is incremented with the other process (Step 160: YES), such data is copied to the EEPROM 11 from the NRAM 27 (Step 170) and the write completion flag X [i] is turned on for such data (Step 180). Thereafter, in the present operation period, writing of data to the SRAM 27 and EEPROM 11 (Step 150, Step 170) is not implemented.

Figure 5:
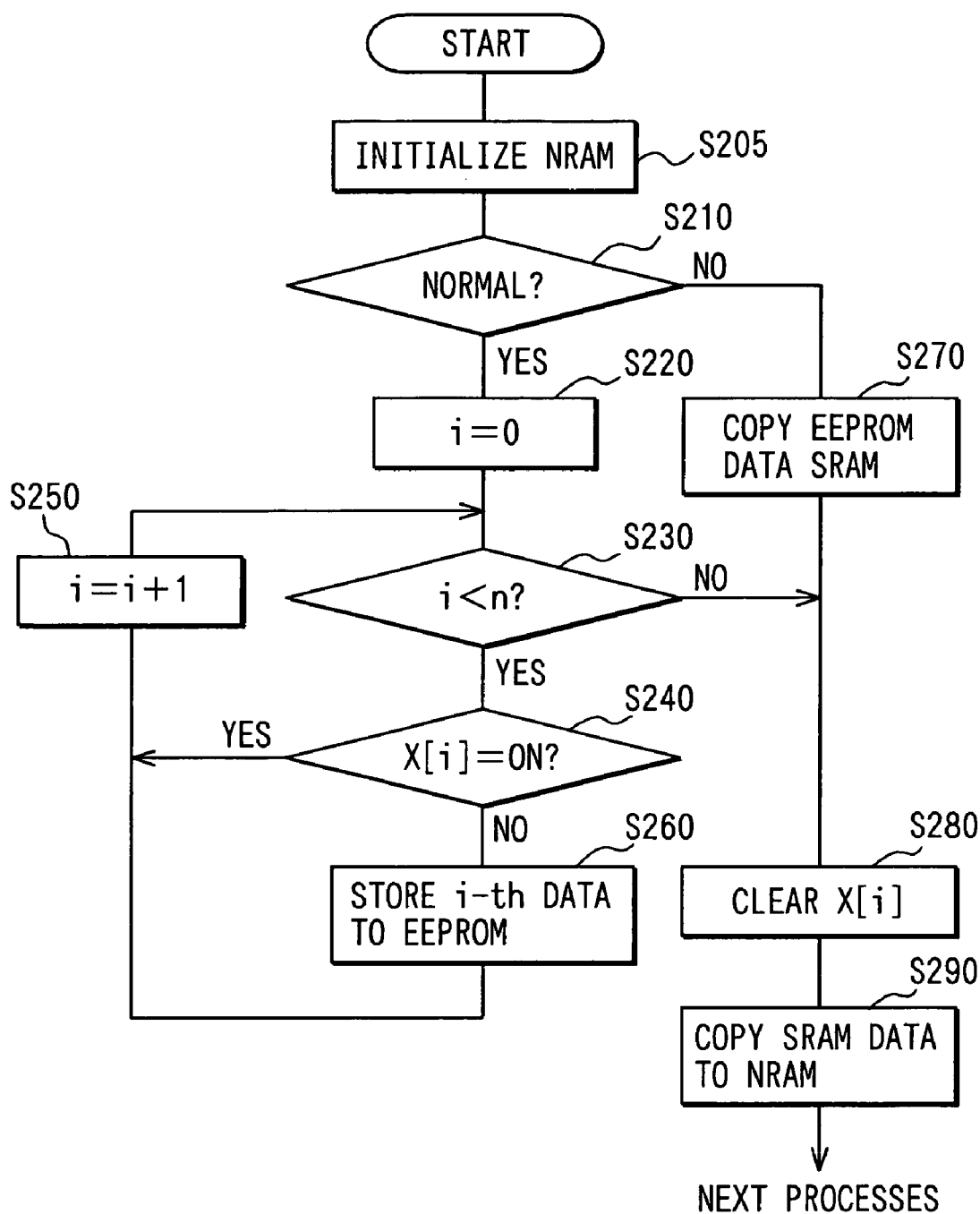
FIG. 5 is a flowchart showing initial processes in the first embodiment.

Next, FIG. 5 is a flowchart showing the initial process executed when the microcomputer 7 starts its operation because the ignition switch 17 is turned on.

As illustrated in FIG. 5, when the microcomputer 7 starts execution of the initial process, the data in the NRAM 27 is initialized at step 205. It is determined whether the data in the SRAM 29 is normal or not at step 210. In this step 210, it is determined whether the battery 19 has been disconnected or not and the data itself in the SRAM 29 is inspected with the parity check method or the like. When the battery 19 is never disconnected and the data itself is normal, the data in the SRAM 29 is determined normal.

When the data in the SRAM 29 is determined normal (Step 210: YES), the process proceeds to step 220 to set the variable i indicating the continuous storage object data number to 0. Subsequently, at step 230, it is determined whether the value of variable i is smaller than the total number of the continuous storage object data (number of data) n or not.

Here, when the value of variable i is determined to be smaller than the number of data n (Step 230: YES), the process proceeds to step 240 to determine whether the write completion flag X[i] in the SRAM 29 is turned on or not for the i-th continuous storage object data. When the write completion flag X[i] is turned on (Step 240: YES), the process shifts to step 250 to increment the value of variable i by one (1). Thereafter, the process returns to step 230.

When the write completion flag X[i] is determined not to be turned on at step 240 (Step 240: NO), the process shifts to step 260 to store (copy) the SRAM value of the i-th continuous storage object data (that is the value of i-th continuous storage object data stored in the SRAM 29 at step 150 of FIG. 4) to the EEPROM 11. Thereafter, the process shifts to step 250 to increment the value of variable i by one (1). Thereafter, the process returns to step 230.

Moreover, when the value of variable i is determined not to be smaller than the number of data n (that is, i≧n) (step 230: NO), the process shifts to step 280 to clear all write completion flags X[i] in the SRAM 29 to OFF. In the subsequent Step 290, all (that is, n) continuous storage object data stored in the SRAM 29 are copied to the NRAM 27 at step 290. Thereafter, various processes such as engine control process and the routine process of FIG. 4 are executed.

Meanwhile, when the data in the SRAM 29 is determined not to be normal at step 210 (Step 210: NO), the process proceeds to step 270 and all (n) continuous storage object data written into the EEPROM 11 are copied to the SRAM 29. Thereafter, the processes at steps 280 and 290 are executed.

That is, in this initial process, when the data in the SRAM 29 is normal (Step 210: YES), the continuous storage object data not written into the EEPROM 11 from the NRAM 27 during the preceding operation period of the ECU 1 is found by checking the write completion flag X [i] for all continuous storage object data with the processes of Steps 220 to 250. When the continuous storage object data not written to the EEPROM 11 exists (step 240: NO), such data is read from the SRAM 29 and is then copied to the EEPROM 11 (step 260).

Moreover, when the data in the SRAM 29 is normal (step 210: YES), it means that the final value of the continuous storage object data up to the preceding operations is stored with the process of step 150 of FIG. 4 is stored in the SRAM 29. Therefore, all continuous storage object data in the SRAM 29 are copied to the NRAM 27 as the work area of the increment process to update the continuous storage object data while it succeeds the value up to the preceding operation period.

In addition, since the final value of the continuous storage object data up to the preceding operations is stored also with the process of step 170 of FIG. 4 (or the process of step 260 of FIG. 5 up to the preceding operations) to the EEPROM 11, if the data in the SRAM 29 is not normal (Step 210: NO), all continuous storage object data in the EEPROM 11 are copied to the SRAM 29 (step 270) and thereafter the process of step 290 is performed. Therefore, if the data in the SRAM 29 becomes irregular due to disconnection of battery or the like, the continuous storage object data up to the preceding operations stored in the EEPROM 11 is copied to the NRAM 27 and thereby the continuous storage object data is updated while the value up to the preceding operation period is succeeded.

In the ECU 1 of the first embodiment, when any continuous storage object data is incremented only by one (1) (step 160: YES) in the single operation period of the ECU 1 through execution of the routine process of FIG. 4 by the microcomputer 7, the write process (step 170) to write the incremented data to the EEPROM 11 is implemented. Moreover, the process to write the data to the EEPROM 11 is not implemented during the subsequent operation period by turning on (Step 180) the write completion flag X[i] for such data (Step 130: YES→Step 140).

Therefore, according to the ECU 1 of the first embodiment, the number of times of data entry to the EEPROM 11 of the continuous storage object data can be controlled. In addition, the data entry to the EEPROM 11 of the continuous storage object data (in more detail, the continuous storage object data having reached the final value in the present operation period through increment of one (1)) can be implemented during the present operation period (that is, while the ignition switch 17 is turned on) where the operation power source voltage VD is stabilized without basically bridging over the operation period. Moreover, when the data entry to the EEPROM 11 of the continuous storage object data is completed, useless process for the entry of such dada to the EEPROM 11 is never executed in the present operation. Therefore, the number of times of data entry to the EEPROM 11 and reliable storage of data can be effectively realized.

Moreover, in the ECU 1 of this first embodiment, the continuous storage object data can periodically stored to the SRAM 29, during the single operation period of this ECU 1 until such data is written into the EEPROM 11 with the write process at step 170 through the execution of the routine process of FIG. 4 by the microcomputer 7 (step 110 to step 150). Since the microcomputer 7 executes the initial process of FIG. 5, the continuous storage object data which has not been entered to the EEPROM 11 at step 170 of FIG. 4 during the preceding operation period is identified (steps 220 to 250) when the ECU 1 starts the operation, upon turning ON of the operation power VD. This identified data is written to the EEPROM 11 from the SRAM 29 (Steps 240: NO→Step 260).

Therefore, even if the operation power VD is turned off before completion of entry to the EEPROM 11 from the NRAM 27 of the continuous storage object data which has been incremented by one (1), such continuous storage object data can be recovered by writing it to the EEPROM 11 from the SRAM 29 when the next operation is started.

For the data entered to the EEPROM 11 from the SRAM 29 with the processes of steps 220 to 260, the final value of such data may be stored only in the SRAM 29 while the operation is stopped. Accordingly, "basically, without bridging over the operation periods" has been described above. However, such event occurs only in the limited rare case where the operation power VD is turned off before the data is entered to the EEPROM 11 at step 170 of FIG. 4, although it has been once incremented by one (1) in the NRAM 27. The processes of steps 220 to 260 are executed to cover the processes in the rare case described above.

Meanwhile, in this embodiment, if the continuous storage object data is updated in its value during single operation period for a plurality of times and is changed only by N at the maximum (that is, amount of unit change of the continuous storage object data is under N), although there is no particular relationship because the amount of unit change (practically, 1) of the continuous storage object data is identical to the maximum amount of change N (practically, 1) during the single operation period, it is determined whether the value of the continuous storage object data has changed by only N or not at step 160 of FIG. 4. In this case, if change of the continuous storage object data during single operation period is under N, the final value of data (that is, data value where amount of change is less than N) can be stored to the EEPROM 11 with the processes at steps 110 to 150 of FIG. 4 and at steps 220 to 260 of FIG. 5.

Moreover, in the ECU 1 of the first embodiment, when the ECU 1 starts the operation because the operation power source voltage VD is turned on, upon execution of the initial process of FIG. 5 by the microcomputer 7, it is determined whether the data in the SRAM 29 is normal or not (Step 210). When the data is determined not to be normal, implementation of process at step 260 to enter the data to the EEPROM 11 from the SRAM 29 is inhibited (Step 210: NO).

Therefore, if disconnection of battery is generated and the data in the SRAM 19 is no longer normal, storing of defective data value to the EEPROM 11 can be prevented.

In the first embodiment, steps 110 to 150 of FIG. 4 correspond to the process for the periodical storing, while steps 220 to 260 of FIG. 5 correspond to the process for a preliminary write implementation. Step 210 of FIG. 5 corresponds to the process for determination. Moreover, step 170 of FIG. 4 corresponds to the process for updating. Moreover, steps 130 and 180 of FIG. 4 correspond to the process for inhibiting updating.

Next, the ECU of a second embodiment will be described.

Figure 6:
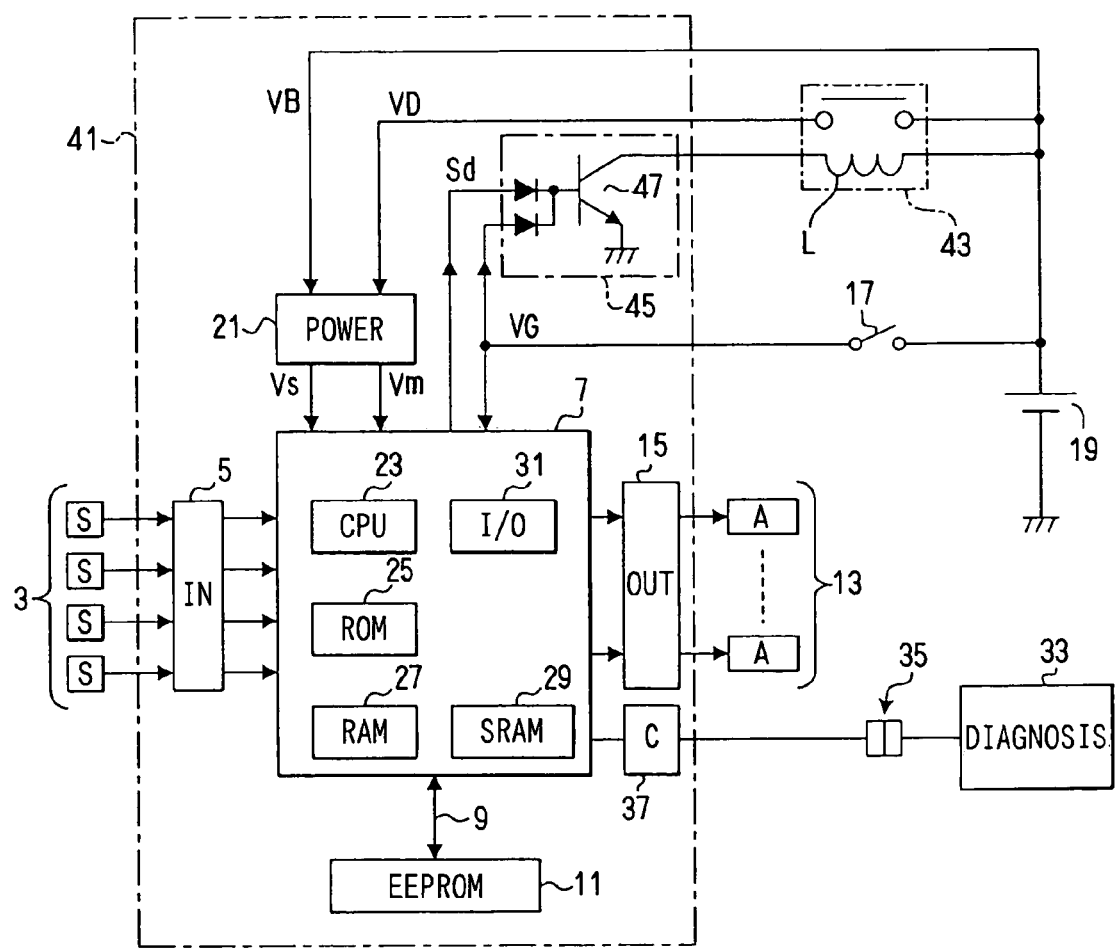
FIG. 6 is a block diagram showing a structure of the ECU according to a second embodiment of the present invention.

First, FIG. 6 is a block diagram showing a structure of the ECU 41 of the second embodiment. The ECU 41 of the second embodiment is also provided to control the engine of vehicle. In FIG. 6, the like elements of the ECU 1 (FIG. 1) of the first embodiment are designated with the like reference numerals and the detail description thereof will be omitted here.

As illustrated in FIG. 6, the ECU 41 of the second embodiment is different in the following points (1) to (5) from the ECU 1 of the first embodiment.

(1) The operation power source voltage VD from the battery 19 is supplied via a main relay 43 as a switching device for power feeding provided at the external side of the ECU 41, not via the ignition switch 17. That is, when the main relay 43 turns on (in more detail, contact of the main relay 43 is closed), the operation power source voltage VD is supplied to the power supply circuit 21 from the battery 19 and the power source voltage Vm is supplied to each circuit of the ECU 41 such as the microcomputer 7.

(2) The ECU 41 is provided with a main relay control circuit 45 to turn on and off the main relay 43.

This main relay control circuit 45 is mainly formed of an NPN transistor 47 where the voltage VG from the battery 19 to be inputted to the ECU 41 via the ignition switch 17 and the drive signal Sd from the microcomputer 7 are supplied to the base after it is supplied through the wired-OR with a diode or the like. To the other end of the coil L of the main relay 43 connected at one end to the positive terminal of the battery 19, the collector of the NPN transistor 47 is connected.

Therefore, when the ignition switch 17 is turned on or the drive signal Sd is outputted from the microcomputer 7, the transistor 47 turns on in the main relay control circuit 45 and the transistor 47 extracts current from the coil L of the main relay 43. Accordingly, the main relay 43 turns on.

Therefore, the operation power source voltage VD is supplied to the ECU 41 when the ignition switch 17 is turned on or when the main relay 43 is turned on with the drive signal Sd from the microcomputer 7. Accordingly, when the ECU 41 starts the operation in the timing that the ignition switch 17 is turned on, the main relay 43 itself is turned on. Thereby, the operation may be continued even after the ignition switch 17 is turned off.

Here, it is also possible to form the structure that the transistor 47 of the main relay control circuit 45 is driven only with the drive signal Sd from the microcomputer 7, the voltage VG from the battery 19 inputted via the ignition switch 17 and the voltage VD from the battery 19 inputted via the main relay 43 are supplied through the wired-OR, and the wired-OR voltage is used as the operation power source of the ECU 41.

(3) In this second embodiment, the SRAM 29 is not used to continuously update the continuous storage object data. Like the increment completion flag F[i], the write completion flag X[i] for the continuous storage object data is set in the NRAM 27. Therefore, the SRAM 29 is mounted in the microcomputer in FIG. 6, but the function to output the sub-power source voltage Vs with this SRAM 29 and the power supply circuit 21 may be deleted.

Figure 7:
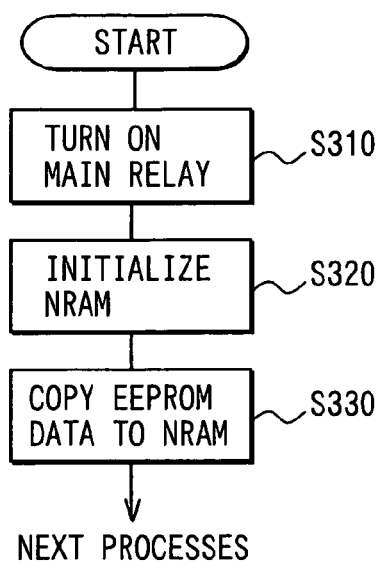
FIG. 7 is a flowchart showing initial processes in the second embodiment.

(4) The microcomputer 7 executes, upon starting the operation because the ignition switch 17 is turned on, the initial process of FIG. 7 in place of the initial process of FIG. 5.

As illustrated in FIG. 7, when the microcomputer 7 starts execution of the initial process, the drive signal Sd is outputted to the main relay control circuit 45 at step 310 to turn on the main relay 43. However, in this timing, the main relay 43 is already turned on with the ON state of the ignition switch 17. Since the drive signal Sd is outputted from the microcomputer 7, the main relay 43 is kept ON even when the ignition switch 17 is turned off later. Next, the data in the NRAM 27 is initialized at step 320. With this initialization, all write completion flags X [i] and the increment completion flags F[i] are cleared to OFF.

Thereafter, at step 330, all (n) continuous storage object data entered in the EEPROM 11 is copied to the NRAM 27 to update thereof while the continuous storage object data succeeds the values up to the preceding operation. Thereafter, various processes such as the engine control process are executed.

Figure 8:
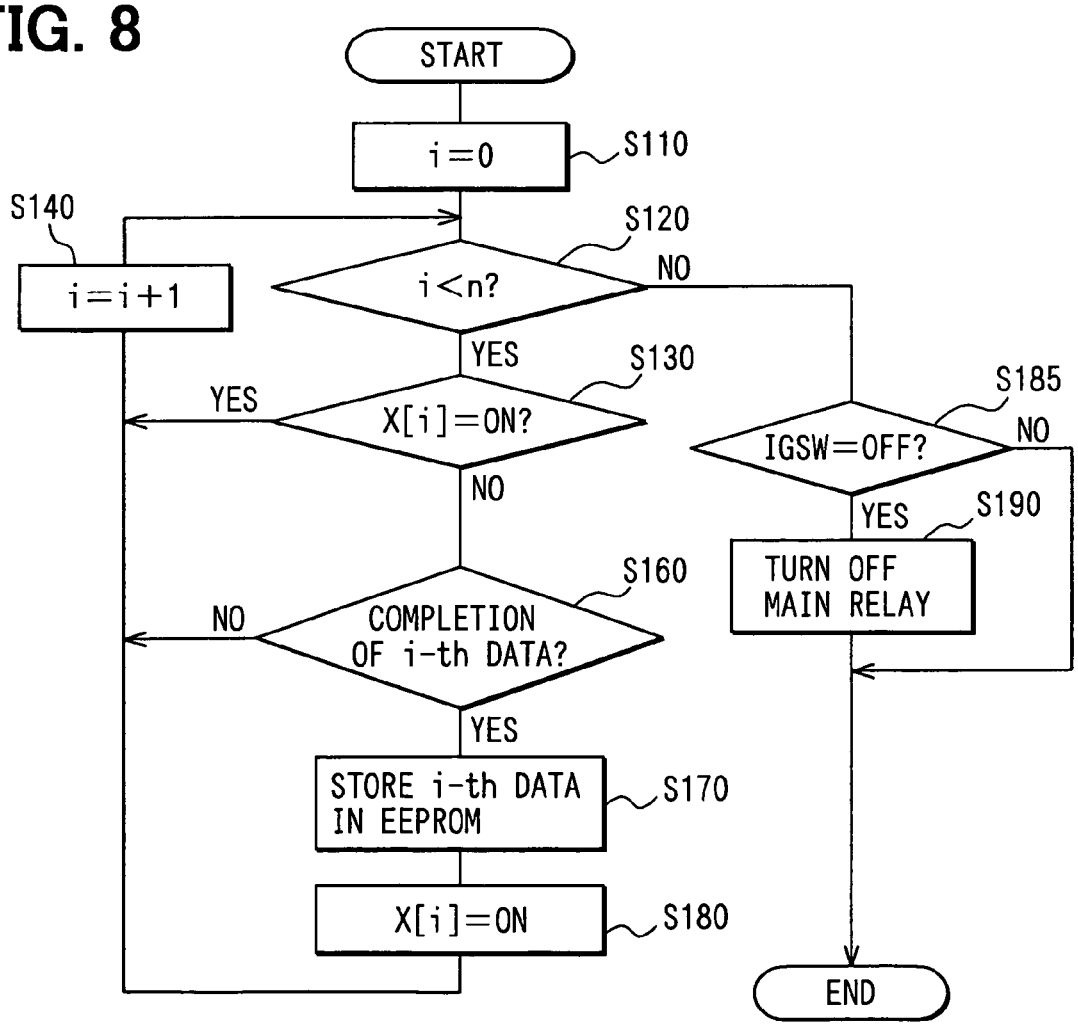
FIG. 8 is a flowchart showing routine processes in the second embodiment.

(5) The microcomputer 7 executes the routine process of FIG. 8 in place of that of FIG. 4. In FIG. 8, the processes same as the routine process of FIG. 4 are designated with the same step numbers of FIG. 4 and therefore detail description thereof will be eliminated. As illustrated in FIG. 8, only the items of (5-1) to (5-3) are different in the routine process of the second embodiment for the routine process (FIG. 4) of the first embodiment.

(1-1) As will be apparent from (3), it is determined whether the write completion flag X[i] in the NRAM 27 is turned on or not for the i-th continuous storage object data at step 130 and moreover the write completion flag X[i] in the NRAM 27 is turned on for the i-th continuous storage object data at step 180.

(5-2) The process of step 150 is deleted.

(5-3) When it is determined that the value of variable i is not smaller than the number of data n at step 120 (Step 120:NO), the routine process is not completed but the process proceeds to step 185 to determine whether the ignition switch 17 is turned off or not. The ON/OFF condition of the ignition switch 17 is determined by the voltage VG.

If the ignition switch 17 is not turned off (step 185: NO), the routine process is completed. If the ignition switch 17 is turned off (step 185: YES), the process proceeds to step 190 to stop output of the drive signal Sd to the main relay control circuit 45 and turn off the main relay 43.

Thereby, the operation power source voltage VD from the main relay 43 is turned off and the operation of the ECU 41 stops.

Even in the ECU 41 of the second embodiment as described above, when any continuous storage object data is incremented only by one (1) (step 160: YES) during the single operation period because the microcomputer 7 executes the routine process of FIG. 8, the write process (step 170) to write the data incremented by one (1) is implemented. Moreover, the process to write such data to the EEPROM 11 is not executed thereafter during the operation period by turning ON the write completion flag X[i] for such data (step 180) (step 130: YES→step 140). Accordingly, reduction in the number of times of data entry to the EEPROM 11 and reliable storage of data can be performed effectively as in the case of the ECU 1 of the first embodiment.

In addition, in the ECU 41 of the second embodiment, if the ignition switch 17 is determined to be turned off when the determination result at step 120 is NO (that is, the processes to write the continuous storage object data incremented by one (1) with the NRAM 27 to the EEPROM 11 are perfectly completed) in the routine process of FIG. 8, the main relay 43 is turned off (step 185: YES→step 190). Therefore, if the ignition switch 17 is turned off, when the continuous storage object data which has been incremented by one (1) (the value has been changed only by N=1) during the present operation period but is not yet entered to the EEPROM 11 exists, such data is completely entered to the EEPROM 11 with the process of step 170 of FIG. 8 and thereafter the main relay 43 is turned off.

Accordingly, even if the ignition switch 17 is turned off before the entry of the continuous storage object data incremented by one (1) to the EEPROM 11 is completed (for example, during the process of step 170), such continuous storage object data may be entered to the EEPROM 11. That is, even in the second embodiment, data entry to the EEPROM 11 of the continuous storage object data is basically implemented while the ignition switch 17 is turned on where the operation power source voltage VD is stabilized. However, only in such a rare case where the ignition switch 17 is turned off before the certain continuous storage object data, which is already incremented by one (1) on the NRAM 27, is entered to the EEPROM 11, the main relay 43 is continuously turned on even after the ignition switch 17 is turned off and the entry of such data to the EEPROM 11 is completed.

Figure 9:
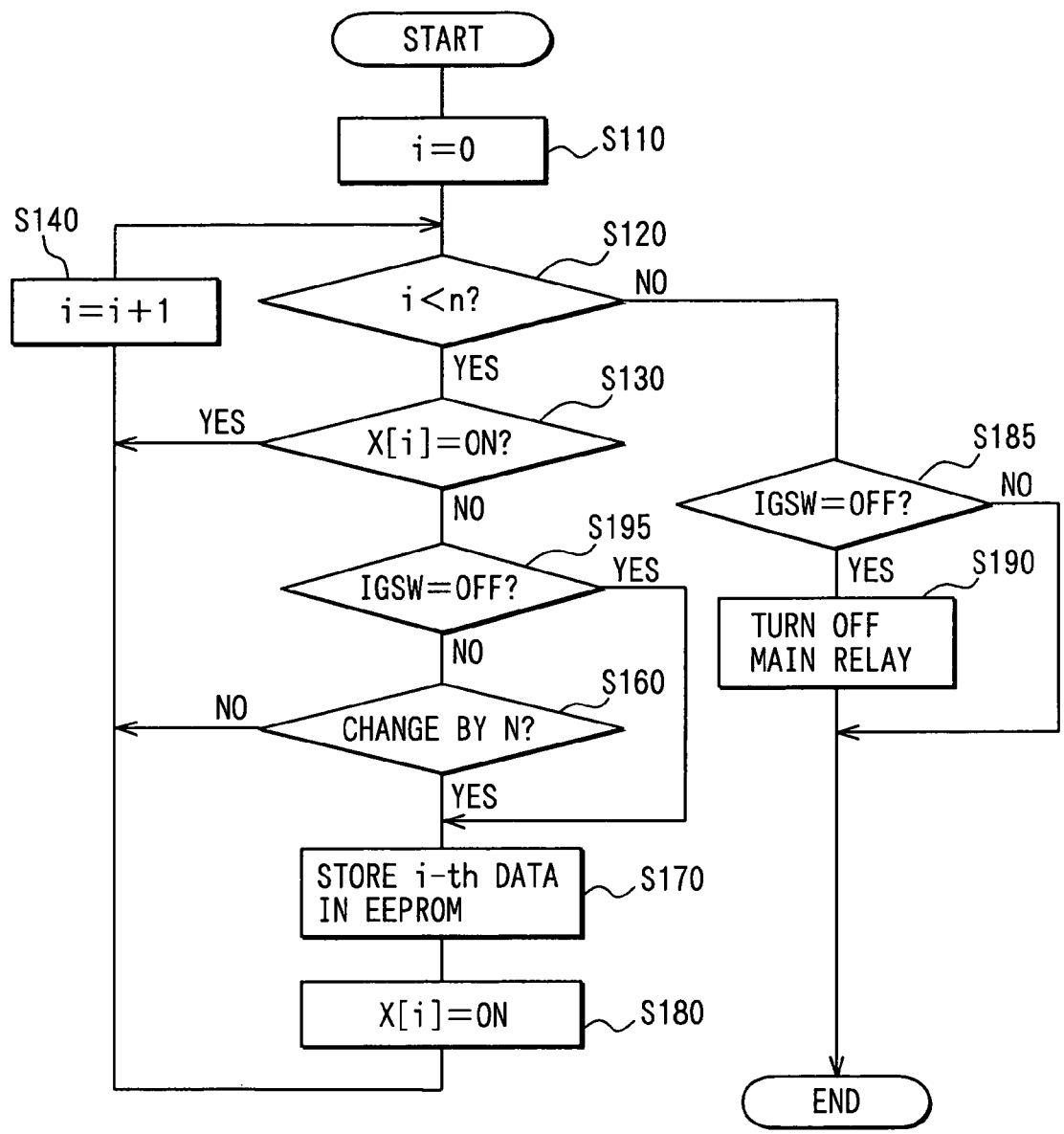
FIG. 9 is a flowchart showing the routine processes as an modification of the second embodiment.

In the case where the value of the continuous storage object data is updated for several times and is changed by N at the maximum during single operation period in the manner that such data is increased, for example, by 0.5 in each step and is increased by three (3) at the maximum or is decreased by one (1) in each step and is decreased by five (5) at the maximum in the single operation period of the ECU 1, the routine process of FIG. 8 is changed as illustrated in FIG. 9.

That is, in the routine process of FIG. 9, it is determined first, at step 160, whether the value of the i-th continuous storage object data has been changed by N (=maximum amount of change in the single operation period) or not.

Next, step 195 is added between steps 130 and 160. When it is determined that the write completion flag X[i] is not yet turned on at step 130, the process proceeds to step 195 to determine whether the ignition switch 17 is turned off or not. When the ignition switch 17 is not yet turned off, the process proceeds to step 160. When the ignition switch 17 is turned off, the process proceeds to step 170 by skipping step 160. At steps 195 and 185, reference is made to the identical internal data which indicates the ON/OFF detection result of the ignition switch 17 so that the determination result of the routine process of the same operation period is never different.

In the structure where the routine process of FIG. 9 is executed, when the ignition switch 17 is turned off when the continuous storage object data not yet entered to the EEPROM 11 exists during the present operation period, the determination result at step 195 is YES and the determination process of step 160 is skipped. Therefore, when the ignition switch 17 is turned off, the continuous storage object data which is not yet entered to the EEPROM 11 during the present operation period is entered to the EEPROM 11 even when such data has been changed only by N on the NRAM 27 or not. Thereafter, the main relay 43 is turned off with the process at step 190.

Therefore, under the structure that the routine process of FIG. 9 is executed, even if the amount of change of the continuous storage object data during the present operation period is less than N, the final value of this data can be stored to the EEPROM 11. Moreover, even if the ignition switch 17 is turned off before the entry of the continuous storage object data which has been changed in the value by N is entered to the EEPROM 11, such continuous storage object data can be entered to the EEPROM 11.

The above embodiments may be modified further as follows. For example, step 150 is provided in the routine process (FIG. 4) of the first embodiment, but it is also possible in place of such flow of steps that the process step to copy all continuous storage object data to the SRAM 29 from the NRAM 27 is provided before step 110. In this case, such a process step corresponds to routine storing. Therefore, each continuous storage object data can be stored periodically to the SRAM 29 even when such data is entered to the EEPROM 11 or not.

In each embodiment described above and in an example of modification thereof, the determination process to determine whether the continuous storage object data should be entered to the EEPROM 11 or not (step 160) and the write process to write such data to the EEPROM 11 (Step 170) are executed in one routine process. However, these processes may be implemented in the format of the function call or sub-routine format or the like for each routine to update the value of the continuous storage object data on the NRAM 27.

Meanwhile, as the programmable non-volatile memory to store the continuous storage object data, a flash ROM, for example, may be used as well as the EEPROM.

Moreover, the continuous storage object data is never limited to that incremented one by one (1) and can also be increased or decreased in a certain unit of change. In addition, the amount of unit change is never required to always be changed in the equal amount.

What is claimed is:

1. An electronic control unit comprising:
   a non-volatile memory, which allows electrical updating of data with a limitation in the number of times of data entry, for continuously storing continuous storage object data required to be stored continuously even when electrical power supply is stopped, wherein the continuous storage object data is increased or decreased in its value depending on a specified rule and is changed in its value by a positive number N at a maximum during a single operation period from power on to power off;
   a control means for executing, on finding that the value of the continuous storage object data is changed in its value by N during the single operation period, a write process to write the continuous storage object data thus changed in its value by N to the non-volatile memory, and for not executing the process to write thereafter the continuous storage object data which has been changed in its value only by N to the non-volatile memory during the same operation period; and
   a standby RAM supplied with an electric power for a continuous storage of data,
   wherein the control means includes a periodical storage means for periodically storing the continuous storage object data to the standby RAM during the operation period until at least the data is entered to the non-volatile memory with the write process, and
   wherein the control means further includes a preliminary write implementation means for writing the continuous storage object data, not yet entered to the non-volatile memory with the write process during a preceding operation period, to the non-volatile memory from the standby RAM when an electric power supply is turned on.

2. The electronic control unit according to claim 1, wherein the control means further includes a determination means for determining whether the data in the standby RAM is normal when the electric power supply is turned on, and for inhibiting the operation of the preliminary write implementation means when the data is determined to be abnormal.

3. An electronic control unit a non-volatile memory, which allows electrical updating of data with a limitation in the number of times of data entry, for continuously storing continuous storage object data required to be stored continuously even when electrical power supply is stopped, wherein the continuous storage object data is increased or decreased in its value depending on a specified rule and is changed in its value by a positive number N at a maximum during a single operation period from power on to power off;
   a control means for executing, on finding that the value of the continuous storage object data is changed in its value by N during the single operation period, a write process to write the continuous storage object data thus changed in its value by N to the non-volatile memory, and for not executing the process to write thereafter the continuous storage object data which has been changed in its value only by N to the non-volatile memory during the same operation period; and wherein;
   the electric power supply is made when a power supply switch is turned on or when a switching means provided externally is turned on for a power supply;
   the control means continues, when powered on and starts its operations, the operations even after the power supply switch is turned off by turning on the switching means for the power supply; and
   the control means enters the continuous storage object data to the non-volatile memory and thereafter turns off the switching means, if the continuous storage object data which has been changed in its value only by N but is not yet entered to the non-volatile memory during the present operation period exists when the power supply switch is turned off.

4. The electronic control unit according to claim 3, wherein:
the control means is provided to control an engine of a vehicle; and
he power supply switch is an ignition switch of the vehicle.

5. An electronic control unit a non-volatile memory, which allows electrical updating of data with a limitation in the number of times of data entry, for continuously storing continuous storage object data required to be stored continuously even when electrical power supply is stopped, wherein the continuous storage object data is increased or decreased in its value depending on a specified rule and is changed in its value by a positive number N at a maximum during a single operation period from power on to power off;
a control means for executing, on finding that the value of the continuous storage object data is changed in its value by N during the single operation period, a write process to write the continuous storage object data thus changed in its value by N to the non-volatile memory, and for not executing the process to write thereafter the continuous storage object data which has been changed in its value only by N to the non-volatile memory during the same operation period; and wherein:
the electric power is supplied when the power supply switch is turned on or when a switching means for a power supply provided externally is turned on;
the control means continues, when powered on and starts its operations, the operations even after the power supply switch is turned off by turning on the switching means for the power supply; and
when the power supply switch is turned off, the continuous storage object data which is not yet entered to the non-volatile memory with the write process during the present operation period is entered to the non-volatile memory, and thereafter the switching means is turned off.

6. An electronic control unit comprising:
a non-volatile memory, which allows electrical updating of data with an effective limitation in the number of times data entry can be effected, for continuously storing continuous storage object data required to be stored continuously even when an electrical power supply to the memory is stopped, wherein the continuous storage object data is increased or decreased in its value depending on a specified rule and is changed in its value by a positive number N at a maximum during a single operation period from power on to power off;
a RAM that is one of a normal RAM and a standby RAM; and
a control means for executing, a write process to write the continuous storage object to the RAM until the value of the continuous storage object data is changed in its value by N during the single operation period and for executing the process to write the continuous storage object data which has been changed in its value only by N and written in the RAM to the non-volatile memory during the same operation period.

7. An electronic control unit as in claim 6 wherein the control means further includes a determination means for determining whether the data in the standby RAM is normal when the electric power supply is turned on, and for inhibiting the operation of the preliminary write implementation means when the data is determined to be abnormal.

8. An electronic control unit as in claim 6 wherein:
the electric power supply is made when a power supply switch is turned on or when a switching means provided externally is turned on for a power supply;
the control means continues, when powered on and starts its operations, the operations even after the power supply switch is turned off by turning on the switching means for the power supply; and
the control means enters the continuous storage object data to the non-volatile memory and thereafter turns off the switching means, if the continuous storage object data which has been changed in its value only by N but is not yet entered to the non-volatile memory during the present operation period exists when the power supply switch is turned off.

9. An electronic control unit as in claim 6 wherein:
the electric power is supplied when the power supply switch is turned on or when a switching means for a power supply provided externally is turned on;
the control means continues, when powered on and starts its operation, the operations even after the power supply switch is turned off by turning on the switching means for the power supply; and
when the power supply switch is turned off, the continuous storage object data which is not yet entered to the non-volatile memory with the write process during the present operation period is entered to the non-volatile memory, and thereafter the switching means is turned off.

10. An electronic control unit as in claim 8 wherein:
the control means is provided to control an engine of a vehicle; and
the power supply switch is an ignition switch of the vehicle.

11. An electronic control unit as in claim 6 wherein said RAM is a standby RAM.

* * * * *